(12) United States Patent
Bauer et al.

(10) Patent No.: US 7,893,532 B2
(45) Date of Patent: Feb. 22, 2011

(54) EXTERNAL CONTACT MATERIAL FOR EXTERNAL CONTACTS OF A SEMICONDUCTOR DEVICE AND METHOD OF MAKING THE SAME

(75) Inventors: Michael Bauer, Nittendorf (DE); Irmgard Escher-Poeppel, Regensburg (DE); Edward Fuergut, Dasing (DE); Simon Jerebic, Regensburg (DE); Bernd Rakow, Regensburg (DE); Peter Strobel, Regensburg (DE); Holger Woerner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 390 days.

(21) Appl. No.: 11/520,035

(22) Filed: Sep. 13, 2006

(65) Prior Publication Data
US 2007/0057372 A1 Mar. 15, 2007

(30) Foreign Application Priority Data
Sep. 13, 2005 (DE) ................. 10 2005 043 808

(51) Int. Cl.
*H01L 23/48* (2006.01)
*H01L 23/52* (2006.01)
*H01L 29/40* (2006.01)

(52) U.S. Cl. .............. 257/734; 257/738; 257/771; 257/69; 257/E23.072; 257/E23.075; 438/119

(58) Field of Classification Search ............... 257/738, 257/734, 771, 772, 23.069, E23.072, E23.075; 438/119
See application file for complete search history.

(56) References Cited

U.S. PATENT DOCUMENTS

| | | | |
|---|---|---|---|
| 6,312,498 B1 | 11/2001 | Lee et al. | |
| 6,563,225 B2 | 5/2003 | Soga et al. | |
| 6,592,020 B1 | 7/2003 | Currie et al. | |
| 6,818,090 B2 | 11/2004 | Hacke et al. | |
| 2002/0176927 A1* | 11/2002 | Kodas et al. | ............. 427/8 |
| 2003/0060066 A1* | 3/2003 | Harada | ............. 439/83 |
| 2005/0106060 A1* | 5/2005 | Kato et al. | ............ 420/560 |
| 2005/0126339 A1* | 6/2005 | Shimizu et al. | ............ 75/331 |
| 2005/0218504 A1* | 10/2005 | Dalton et al. | ............ 257/702 |
| 2005/0233203 A1* | 10/2005 | Hampden-Smith et al. | ..... 429/44 |
| 2006/0267218 A1* | 11/2006 | Hozoji et al. | ............ 257/782 |
| 2006/0272747 A1* | 12/2006 | Wang et al. | ............ 148/23 |
| 2008/0110530 A1* | 5/2008 | Wilson et al. | ............ 148/23 |

FOREIGN PATENT DOCUMENTS

| | | |
|---|---|---|
| JP | 04245448 A | 9/1992 |
| JP | 11214447 A | 8/1999 |
| JP | 11288968 A | 10/1999 |
| WO | WO 00/04584 | 1/2000 |

* cited by examiner

*Primary Examiner*—Cuong Q Nguyen
*Assistant Examiner*—Cathy N Lam
(74) *Attorney, Agent, or Firm*—Edell, Shapiro & Finnan, LLC

(57) ABSTRACT

An external contact material for external contacts of a semiconductor device and a method for producing the same are described. The external contact material includes a lead-free solder material. Provided in the solder material is a filler which forms a plurality of gas pores and/or has plastic particles which are arranged in the volume of the solder material.

13 Claims, 3 Drawing Sheets

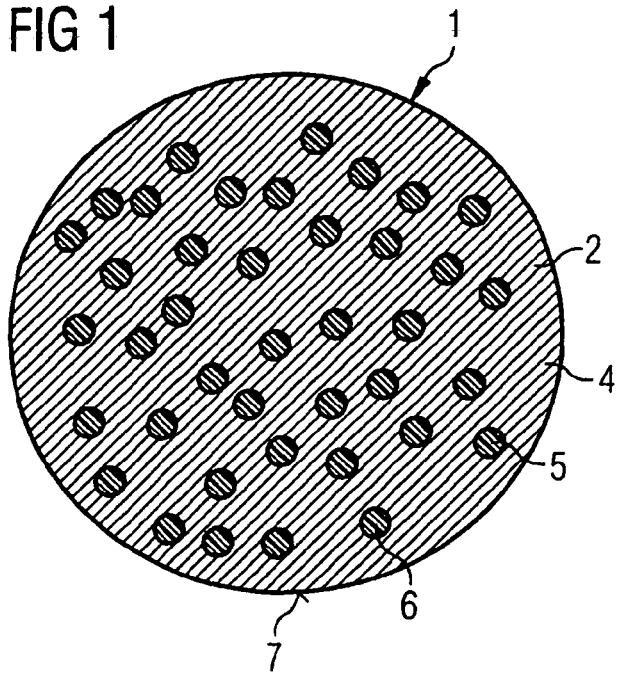
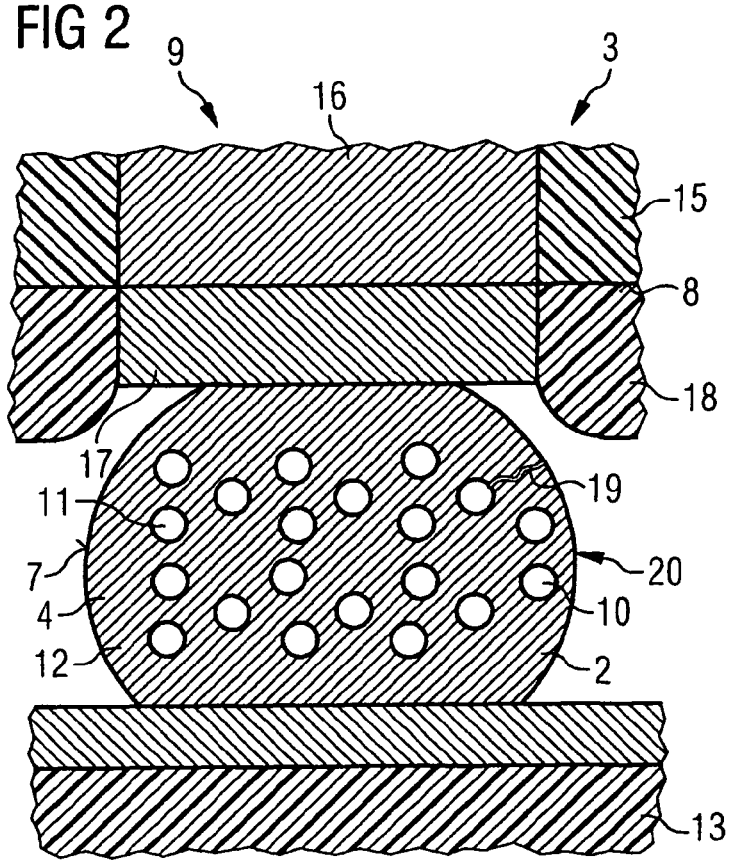

Prior Art

EXTERNAL CONTACT MATERIAL FOR EXTERNAL CONTACTS OF A SEMICONDUCTOR DEVICE AND METHOD OF MAKING THE SAME

CROSS REFERENCE TO RELATED APPLICATIONS

This application claims priority under 35 U.S.C. §119 to Application No. DE 102005043808.3 filed on Sep. 13, 2005, entitled "External Contact Material for External Contacts of a Semiconductor Device and Use of The External Contact Material," the entire contents of which are hereby incorporated by reference.

FIELD OF THE INVENTION

The invention relates to an external contact material for external contacts of a semiconductor device that includes a solder material and a plastic.

BACKGROUND

The publication WO 00/04584 discloses an external contact for a semiconductor device which comprises plastic and a metal. In this case, the external contact of the semiconductor device comprises a plastic ball which has an inner body of plastic which is coated on the outside with a metal layer. Such an external contact is preferably used for semiconductor devices in a semiconductor chip format in which the semiconductor device virtually corresponds in its two-dimensional extent to the semiconductor chip. The metal-coated plastic ball achieves the effect of an external contact which is compliant on account of the plastic balls and consequently offers the possibility of connecting the intrinsically rigid semiconductor chip of the semiconductor device in the semiconductor chip format to a higher-level circuit board, such circuit boards of plastic having a much higher coefficient of expansion than the semiconductor device in the semiconductor chip format.

The external contact of the semiconductor device comprising a plastic ball with a metal coating has adequate compliance to compensate for thermal stress under thermal loading between the circuit board and the semiconductor device by virtue of its compliance. The disadvantage of such an external contact is that such external contacts can only be produced with great technical expenditure, since it is first necessary to produce plastic balls and then to coat them with a metal layer. The risk of delamination of such metal coatings cannot be ruled out, so that under thermal loading there is the risk that interruptions in the connection of the circuit board may occur. Consequently, not only is there a high level of production expenditure but also a problem with the reliability of using such compliant external contacts that comprise a plastic core and a metal coating.

In addition, it is known that there is a high demand for external contact balls for the so-called BGA package (Ball Grid Array package). In particular, the demand for lead-free solder balls is great. However, such lead-free solder balls 7, as are shown in FIG. 5, have the disadvantage that intermetallic phases may form, causing such solder balls 7 to become brittle, and consequently a semiconductor device 3 to become sensitive to shock once it has been mounted on a higher-level circuit board 13. Under shock loading, brittle rupture 14 of the external contact 2 may occur on account of the intermetallic phases in the lead-free solder balls 7. Furthermore, there is a demand to push ahead with the miniaturization of such lead-free solder balls 7, so that the three-dimensional extent is further reduced.

In order nevertheless to increase the shock immunity, an insulating and stabilizing underfill material is introduced between the surface-mountable solder balls of the BGA package and the higher-level circuit board, with the intention of reducing the shock sensitivity of the solder balls with intermetallic phases. For this purpose, however, a reserve area has to be provided on the higher-level circuit board around the semiconductor device with lead-free solder balls, in order to introduce this underfill material. Furthermore, the introduction of such an underfill material means additional expenditure for the customer wishing to load a higher-level circuit board.

SUMMARY

An external contact material for external contacts of a semiconductor device provides surface-mountable external contacts which have adequate compliance to reduce thermal stresses between a higher-level circuit board and the semiconductor device. The external contact material comprises a lead-free solder material. Provided in the solder material is a filler which forms a plurality of gas pores and/or has plastic particles which are arranged in the volume of the solder material.

The above and still further features and advantages of the present device will become apparent upon consideration of the following definitions, descriptions and descriptive figures of specific embodiments thereof, wherein like reference numerals in the various figures are utilized to designate like components. While these descriptions go into specific details of the device, it should be understood that variations may and do exist and would be apparent to those skilled in the art based on the descriptions herein.

BRIEF DESCRIPTION OF THE DRAWINGS

The described device is explained in more detail below with reference to exemplary embodiments, where:

FIG. 1 shows a schematic cross section through a solder ball which comprises external contact material according to a first embodiment;

FIG. 2 shows a schematic cross section through an external contact which comprises external contact material according to a second embodiment;

DETAILED DESCRIPTION

Figure 3:
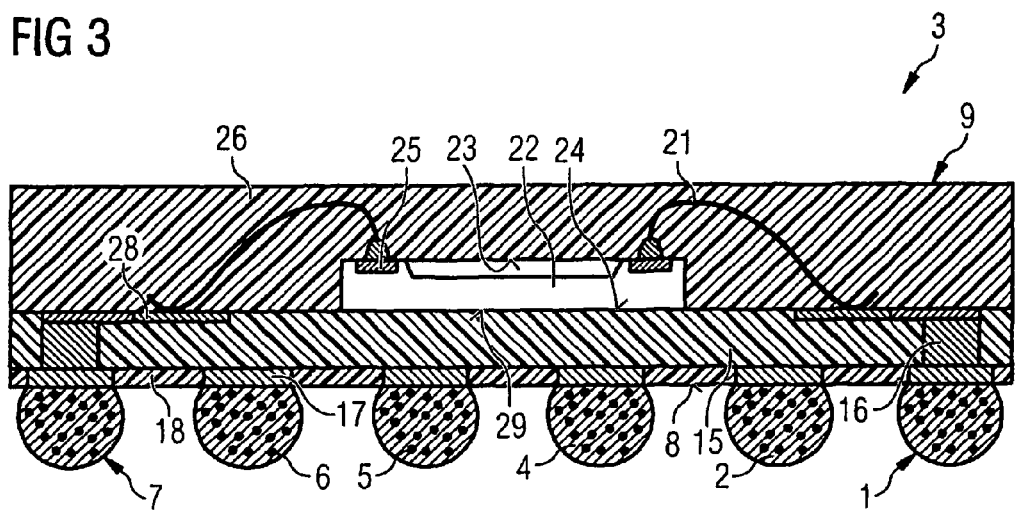
FIG. 3 shows a cross section through a semiconductor device with external contact material according to the first embodiment.

An external contact material for external contacts of a semiconductor device overcomes the disadvantages of the prior art and provides surface-mountable external contacts which have adequate compliance to reduce thermal stresses between a higher-level circuit board and the semiconductor device. In addition, a semiconductor device comprises external contacts with the external contact material according to the described device.

An external contact material for external contacts of a semiconductor device is provided. In this case, the external contact material comprises a lead-free solder material. Provided in the solder material is a filler which forms a multiplicity of gas pores and/or has plastic particles which are arranged in the volume of the solder material.

Such an external contact material has the advantage that it is flexible and compliant, since both the gas pores and alternatively the corresponding plastic particles in the solder material permit a corresponding compliance of the external contact. At the same time, the solder material ensures that the external contacts can on the one hand be attached to the semiconductor device and on the other hand can be surface-mounted with a higher-level circuit board without great expenditure. In addition, it is possible either to distribute the gas pores and/or the plastic particles uniformly in the volume of the solder material or to achieve a random distribution.

While in the case of uniform distribution anisotropic preferential directions in which the compliance is greater than in neighboring regions may occur, in the case of random distribution the properties are distributed isotropically over the external contact material or over the external contact. Accordingly, the uniform distribution of the gas pores and/or plastic particles promotes anisotropy and the random distribution of the gas pores and/or plastic particles promotes the isotropic distribution of the elastomeric and plastic properties of the external contacts made of the external contact material according to the described device.

In a preferred embodiment, the average size k of the gas pores and/or plastic particles lies in the range of $1\ \mu m \leqq k \leqq 100\ \mu m$. This average size k is achieved on the one hand by mixing corresponding plastic particles with a solder material, in that a corresponding size k is chosen for the plastic particles, or by the corresponding fine or coarse distribution of the particles decomposing into gas pores during the production process of spherical external contacts.

The plastic particles which can be admixed with a solder material in the size class or average size specified above preferably comprise silicones, thermoplastics and/or elastomers. Of these, silicone rubber is known for its compliance and its compatibility and wettability by corresponding lead-free solder materials. Among the thermoplastics, compliance is not always obtained; rather, thermoplastics may well constitute brittle materials after curing, so that here only a small selection of thermoplastics provides the suitable compliant elastomeric properties.

Among the elastomers, it is generally known that relatively stable metal-rubber compounds can be produced, since the solder material enters into a bond with the elastomers on account of van der Waals' forces. This cohesion of the external contact materials is decisive for their suitability for use in semiconductor technology or for their suitability for use as external contacts of a semiconductor device.

Gold solder, silver solder, tin solder and/or alloys of the same is/are used with preference as the solder material. The composition and alloying of such lead-free solder materials is generally known and is not discussed further.

In order to use the external contact material for so-called BGA packages (Ball Grid Array packages), the external contact material is preferred in solder ball form. In this case, the external contact material preferably has a solder ball diameter d in the range of $150\ \mu m \leqq d \leqq 3000\ \mu m$. The size of the plastic particles or the gas pores is preferably adapted to such a solder ball diameter, i.e., in the case of small solder ball diameters of 150 μm and more, plastic particle diameters in the lower range of 1 μm to approximately 10 μm are used, whereas in the case of diameters of the solder balls for external contacts in the upper sector of up to 3 mm larger gas pores or plastic particles may also be provided in the external contact material.

The level of filler for plastic particles in the external contact materials preferably lies in the range of 20% by volume $\leqq f \leqq 80\%$ by volume. Such a level of filler f can be flexibly handled, depending on the requirement for the properties of the external contact material.

With respect to the filler particles which decompose and deposit gaseous, low molecular weight decomposition products when a softening temperature of the solder material in the external contact material is reached, the size classes of the filler are even partly provided in the nanometer range, in order to achieve a fine distribution of gas pores. The low molecular weight decomposition products may comprise oxygen, nitrogen and/or carbon dioxide, carbon monoxide and/or water molecules.

For this purpose, the particles which deposit gaseous low molecular weight decomposition products preferably comprise hydrides. These hydrides readily decompose into low molecular weight decomposition products at relatively low temperatures, as do occur during the soldering of external contacts. Furthermore, it is possible that the particles which deposit gaseous low molecular weight decomposition products constitute carbonates. The carbonates which usually give off carbon monoxide and/or carbon dioxide as gaseous products, and thereby form gas pores, can be mixed relatively favorably with the solder material as a filler, since the wettability is relatively high.

The volume fraction g of gas pores with the external contact material lies in the range of 20% by volume $\leqq g \leqq 90\%$ by volume. In the case of high porosity as a result of corresponding gas pores, the solder material may be transformed into a metallic sponge by the decomposition of the suitable filler.

A semiconductor device with external contacts on the underside of the semiconductor device is provided. The external contacts comprise a lead-free solder material as the external contact material. Provided in the solder material is a filler which forms a multiplicity of gas pores and/or comprises plastic particles which are arranged in the volume of the solder material. In this case, the solder material with the filler or with the gas pores is varied in a way corresponding to the embodiments specified above. To avoid repetition, the individual embodiments are not discussed in detail. In principle, the semiconductor device is equipped with such external contacts on the basis of the external contact material according to the described device.

A method for producing external contact material for external contacts of a semiconductor device includes: preparing a mixture of solder material particles and particles which either form gas pores or remain unchanged as plastic particles; introducing the mixture into a prilling unit and heating the mixture precisely to the melting temperature of the solder material particles thereby simultaneously softening the plastic particles and/or simultaneously decomposing the particles thus forming gas pores in the material within the prilling unit; introducing this heated-up mixture into a vibratory prilling nozzle and catching the spherical drops falling from the vibratory prilling nozzle in a cooling liquid bath.

Such a method has the advantage that a multiplicity of external contacts can be produced with the external contact material according to the described device. In addition, the method has the advantage that the diameters can be chosen by the setting and the dimensions of the vibratory prilling nozzle. Likewise as result of the rapid cooling in a cooling liquid bath, the method also has the advantage that the solder material cannot form brittle intermetallic phases, but rather solidifies in fine crystalline form and incorporates the corresponding gas pores or the plastic particles in the volume of the spherical drop.

Plastic particles of which the average grain size is larger than the average grain size of the solder material particles are used for this method. This has the advantage that the solder material particles can become lodged in all the interstices forming between the plastic particles, and consequently permits homogeneous wetting of the plastic particles.

In a further preferred embodiment, particles which decompose when heated and the average grain size of which is smaller than the average grain size of the solder particles are used. This advantageously has the effect that a fine distribution of the gas pores becomes possible, especially since a high number of decomposing filling material particles can be accommodated in the solder material. In the case of plastic particles, particles which comprise a polymer with a low modulus of elasticity and high degree of compliance are preferred. The same applies to thermoplastics. For the present application, these should also have a low modulus of elasticity and high degree of compliance in order to be used as plastic particles.

Particularly preferred are elastomers and silicone rubbers that are used as plastic particles. Hydrides and carbonates have so far proven successful as particles which decompose and deposit gaseous low molecular weight decomposition products when a softening temperature of the external contact material is reached, the hydrides giving off hydrogen compounds, water or OH groups, and the carbonates giving off carbon monoxides or carbon dioxide. These decomposition products are used to create gas pores in the external contact material, transforming the otherwise rigid and brittle, nonmetallic solder material into a metallic sponge, which itself has a high degree of compliance after the soldering-on or so-called "reflow process."

Figure 5:
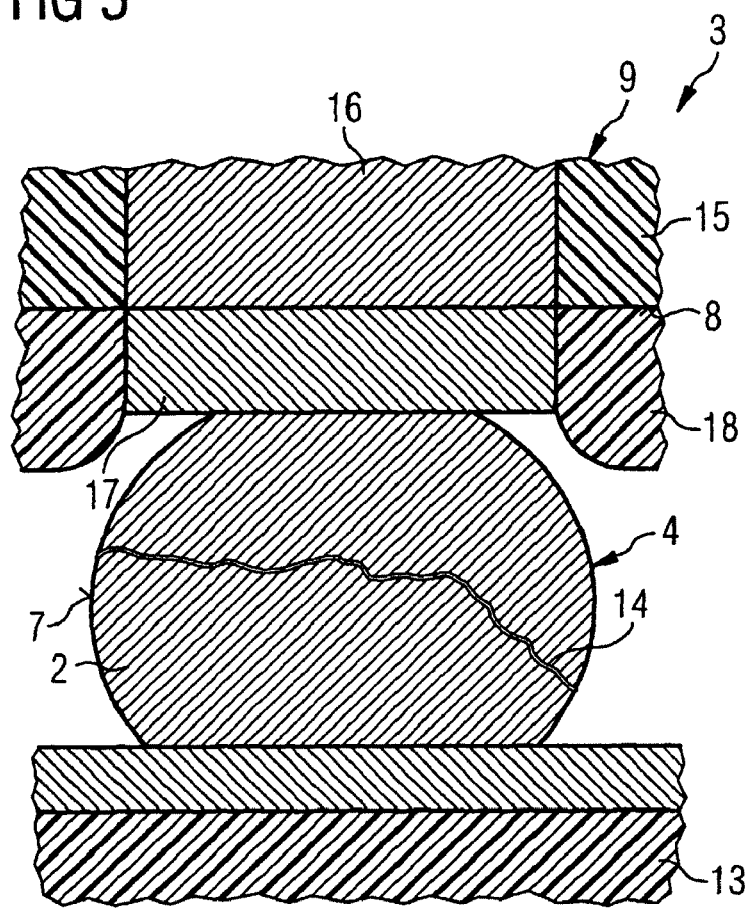
FIG. 5 shows a schematic cross section through an external contact which comprises external contact material of a lead-free solder material according to the prior art.

FIG. 1 shows a schematic cross section through a solder ball 7, which comprises external contact material 1 according to a first exemplary embodiment of the invention. The solder ball 7 is preferably used as an external contact 2 for semiconductor devices. With this first embodiment, the solder material comprises a silver-tin solder alloy, which in the soldering process forms intermetallic phases and consequently makes the soldered connection become brittle, so that brittle ruptures, as are shown in FIG. 5, can occur.

In order to counteract this tendency and make it possible for such a form of solder ball 7 not to have any brittle rupture cracks even under abrupt mechanical loading, or to prevent brittle rupture cracks from spreading, the solder ball 7 in this first has fillers 5 which comprise plastic particles 6 which comprise an elastomer, a silicone rubber and/or a thermoplastic with a low modulus of elasticity and high degree of compliance. The average size k of these plastic particles lies in the range of 1 $\mu m \leq k \leq 100$ $\mu m$, in this embodiment the plastic particles being randomly distributed in the volume of the solder balls.

The solder balls themselves are produced by a mixture of plastic particles 6 and solder material 4 being fed to a prilling unit, this mixture being fed after melting of the lead-free solder material 4 and simultaneous softening of the plastic particles 6 to a prilling nozzle, and the prilled solder balls falling into a cooling liquid bath, in which they rapidly solidify and do not form intermetallic phases. These intermetallic phases do not form until the soldering-on process on a semiconductor package or the soldering-on process during the surface mounting on a higher-level circuit board.

FIG. 2 shows a schematic cross section through an external contact 2, which comprises external contact material 20 according to a second embodiment. This external contact 2 belongs to a semiconductor device 3, comprising a substrate 15, through which a contact via 16 which ends on an external contact area 17 is led, the external contact 2 being fixed on this external contact area 17. The external contact material 20 of this external contact 2 has gas pores 10, which develop from a filler material which decomposes at the melting temperature or prilling temperature of the solder ball 7 or the solder material 4 and forms low molecular weight decomposition products 11, such as oxygen, nitrogen, water, carbon monoxide and/or carbon dioxide, and consequently forms the gas pores 10 shown in FIG. 2.

Although this external contact material 20 also exhibits microcracks 19 under abrupt loading, they cannot spread and are stopped from spreading at one of the gas pores 10, so that such external contacts 2 withstand the so-called shock tests and do not react by the external contact 2 being torn off. A further advantage is that, during mounting on the shown higher-level circuit board 13, it is possible to dispense with application of an underfill material, which makes the surface mounting of a semiconductor device with such external contacts 2 considerably easier and also saves surface area, especially since no surface area has to be provided for the tools for applying the underfill material between the semiconductor device 3 and the higher-level circuit board 13.

FIG. 3 shows a schematic cross section through a semiconductor device 3 with external contacts 2 according to the first embodiment. This semiconductor device 3 has a Ball Grid Array (BGA) package 9, which has surface-mountable external contacts 2 on its underside 8. These surface-mountable external contacts 2 comprise an external contact material 1 which has along with a lead-free solder material 4 plastic particles 6 in the volume of the external contacts 2. The external contacts 2 are connected by way of external contact areas 17 and contact vias 16 of a wiring substrate 15 to a wiring structure 28 on the upper side 29 of the wiring substrate 15 and are surrounded by a solder resist layer 18.

Arranged on this upper side 29, a semiconductor chip 22 is embedded in a plastic package molding compound 26, which is fixed with its rear side 24 on the upper side 29 of the wiring substrate 15. Arranged on the active upper side 23 of the semiconductor chip 22 are contact areas 25, which are electrically connected by way of bonding wires 21 to the wiring structure 28 of the wiring substrate 15. Consequently, the external contacts 2 with the external contact material 1 according to the described device are electrically connected via the wiring substrate and the bonding wires to the contact areas 25 of the active upper side 23 of the semiconductor chip 22. During surface mounting of these semiconductor devices 3 on a higher-level circuit board, it is then not necessary for the fixing of the semiconductor device 3 on the higher-level circuit board to be supported by an underfill material, especially since the compliant external contacts 2 filled with plastic particles 6 damp both thermal stresses and shock loads.

Figure 4:
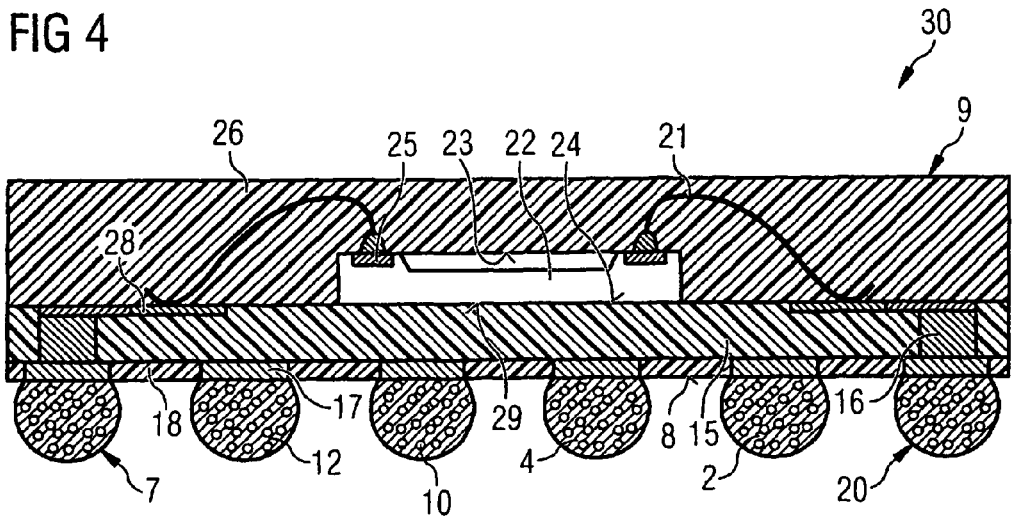
FIG. 4 shows a schematic cross section through a semiconductor device with external contacts of an external contact material according to the second embodiment.

FIG. 4 shows a schematic cross section through a semiconductor device 30 with external contacts 2 of an external contact material 20 according to a second embodiment. Components with the same functions as in FIG. 3 are identified by the same designations and are not separately explained.

The external contacts 2 with the external contact material 20 in this embodiment differ from the embodiment according to FIG. 1 and FIG. 3 in that instead of the elastomer particles, gas pores 10 are now arranged in the external contact material 20, preventing cracks from spreading under abrupt loading of the external contact material 20. These external contacts 2 comprising metallic sponge 12 are similarly compliant to the external contacts filled with plastic material of the first embodiment.

Having described exemplary embodiments, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

LIST OF REFERENCE SYMBOLS

1 external contact material (1st embodiment)
2 external contact
3 semiconductor device
4 solder material
5 filler
6 plastic particles
7 solder ball form
8 underside of the semiconductor device
9 BGA package
10 gas pores
11 decomposition product
12 metallic sponge
13 higher-level circuit board
14 brittle rupture
15 wiring substrate
16 contact via
17 external contact area
18 solder resist
19 microcrack
20 external contact material (2nd embodiment)
21 bonding wire
22 semiconductor chip
23 upper side of the semiconductor chip
24 rear side of the semiconductor chip
25 contact area
26 plastic package molding compound
28 wiring structure
29 upper side of the wiring substrate
30 semiconductor device (2nd embodiment)
f level of filler of plastic particles
g volume fraction of gas pores
k average size of the particles

What is claimed is:

1. An external contact material for external contacts of a semiconductor device, the external contact material comprising:
   a lead-free solder material; and
   a filler forming a plurality of gas pores that are arranged in a volume of the lead-free solder material, wherein the external contact material has a volume fraction of gas pores that lies within the range of 20%-90% by volume, wherein the external contact material comprises a solder ball.

2. The external contact material as claimed in claim 1, wherein the gas pores are uniformly distributed in the volume of the solder material.

3. The external contact material as claimed in claim 1, wherein the gas pores are randomly distributed in the volume of the solder material.

4. The external contact material as claimed in claim 1, wherein the average size of the gas pores lies within the range of 1 µm-100 µm.

5. The external contact material as claimed claim 1, wherein the solder material comprises at least one of: gold, silver, tin, and alloys of gold, silver, or tin.

6. The external contact material as claimed in claim 1, wherein a diameter of the solder ball is in the range of 150 µm-3000 µm.

7. The external contact material as claimed in claim 1, wherein the filler comprises particles that decompose and deposit gaseous low molecular weight decomposition products in response to a softening temperature of the external contact material being reached.

8. The external contact material as claimed in claim 7, wherein the filler comprises hydrides.

9. The external contact material as claimed in claim 7, wherein the filler comprises carbonates.

10. The external contact material as claimed in claim 7, wherein the external contact material comprises a metallic sponge.

11. A semiconductor device comprising a plurality of the external contacts of claim 1, the external contacts being disposed on an underside of the semiconductor device.

12. The semiconductor device as claimed in claim 11, wherein the semiconductor device comprises a ball grid array (BGA) package.

13. The external contact material as claimed in claim 1, wherein the plurality of gas pores are provided in the solder material.

* * * * *